United States Patent
Rossi et al.

(10) Patent No.: US 10,823,789 B2
(45) Date of Patent: Nov. 3, 2020

(54) FAST-SWITCHING DRIVER CIRCUIT FOR AN INDUCTIVE LOAD

(71) Applicant: Allegro MicroSystems, LLC, Manchester, NH (US)

(72) Inventors: Conrado Rossi, Montevideo (UY); Hernán D. Romero, Buenos Aires (AR); Maria C. Costa, Bristol (GB)

(73) Assignee: Allegro MicroSystems, LLC, Manchester, NH (US)

( * ) Notice: Subject to any disclaimer, the term of this patent is extended or adjusted under 35 U.S.C. 154(b) by 271 days.

(21) Appl. No.: 16/139,558

(22) Filed: Sep. 24, 2018

(65) Prior Publication Data

US 2020/0096576 A1    Mar. 26, 2020

(51) Int. Cl.
| | | |
|---|---|---|
| *G01R 33/028* | (2006.01) | |
| *G01R 33/07* | (2006.01) | |
| *G01D 5/14* | (2006.01) | |
| *H01L 43/04* | (2006.01) | |
| *H01L 43/06* | (2006.01) | |

(52) U.S. Cl.
CPC ........... *G01R 33/077* (2013.01); *G01D 5/145* (2013.01); *H01L 43/04* (2013.01); *H01L 43/065* (2013.01)

(58) Field of Classification Search
USPC ........................................................ 324/251
See application file for complete search history.

(56) References Cited

U.S. PATENT DOCUMENTS

| | | | |
|---|---|---|---|
| 6,285,221 B1 * | 9/2001 | Leighton | G11B 5/02 327/110 |
| 7,705,586 B2 | 4/2010 | Van Zon et al. | |
| 2012/0014682 A1 * | 1/2012 | David | G01D 5/145 396/133 |

FOREIGN PATENT DOCUMENTS

EP        1797496        7/2009

* cited by examiner

*Primary Examiner* — Farhana A Hoque
*Assistant Examiner* — Courtney G McDonnough
(74) *Attorney, Agent, or Firm* — Daly, Crowley, Mofford & Durkee, LLP

(57) ABSTRACT

A driver circuit includes a power terminal, a reference terminal, and a bridge circuit. The bridge circuit comprises a first switch coupled to the power terminal, a second switch coupled in series between the first switch and the reference terminal to form a first output terminal between the first and second switches, a third switch coupled to the power terminal, and a fourth switch coupled in series between the third switch and the reference terminal to form a second output terminal between the third and fourth switches. The second and fourth switches are PNP BJT devices.

21 Claims, 4 Drawing Sheets

FAST-SWITCHING DRIVER CIRCUIT FOR AN INDUCTIVE LOAD

FIELD

This disclosure relates to driver circuits and, more specifically, coil driver circuits with fast switching capability.

BACKGROUND

Magnetic field sensors are used in many applications, ranging from automotive to video game controllers. Many magnetic field sensors include an inductive coil and a circuit that drives current through the inductive coil to produce a magnetic field. The sensor may then detect the magnetic field to determine the position (or other states) of a target.

Some magnetic field sensors drive an alternating current through the coil in order to produce an alternating magnetic field. However, the inductive coil may impede changes to the current flowing through it due to the build-up of self-induced voltage due to the variation of the magnetic field it produces. This impedance may limit the frequency of the alternating current through the coil.

SUMMARY

In an embodiment, a driver circuit includes a power terminal, a reference terminal, and a bridge circuit. The bridge circuit comprises a first switch coupled to the power terminal, a second switch coupled in series between the first switch and the reference terminal to form a first output terminal between the first and second switches, a third switch coupled to the power terminal, and a fourth switch coupled in series between the third switch and the reference terminal to form a second output terminal between the third and fourth switches. The second and fourth switches are PNP bipolar junction transistor ("BJT") devices.

In another embodiment, a system comprises a coil having a first winding terminal and a second winding terminal, a power terminal, a reference terminal, and a bridge circuit. The bridge circuit comprises a first switch coupled to the power terminal, and a second switch coupled in series between the first switch and the reference terminal to form a first output terminal between the first and second switches. The first output terminal is coupled to the first winding terminal of the coil. The bridge circuit also includes a third switch coupled to the power terminal and a fourth switch coupled in series between the third switch and the reference terminal to form a second output terminal between the third and fourth switches. The second output terminal is coupled to the second winding terminal of the coil. The second and fourth switches are PNP BJT devices.

BRIEF DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more exemplary embodiments. Accordingly, the figures are not intended to limit the scope of the invention. Like numbers in the figures denote like elements.

DETAILED DESCRIPTION

Figure 1:
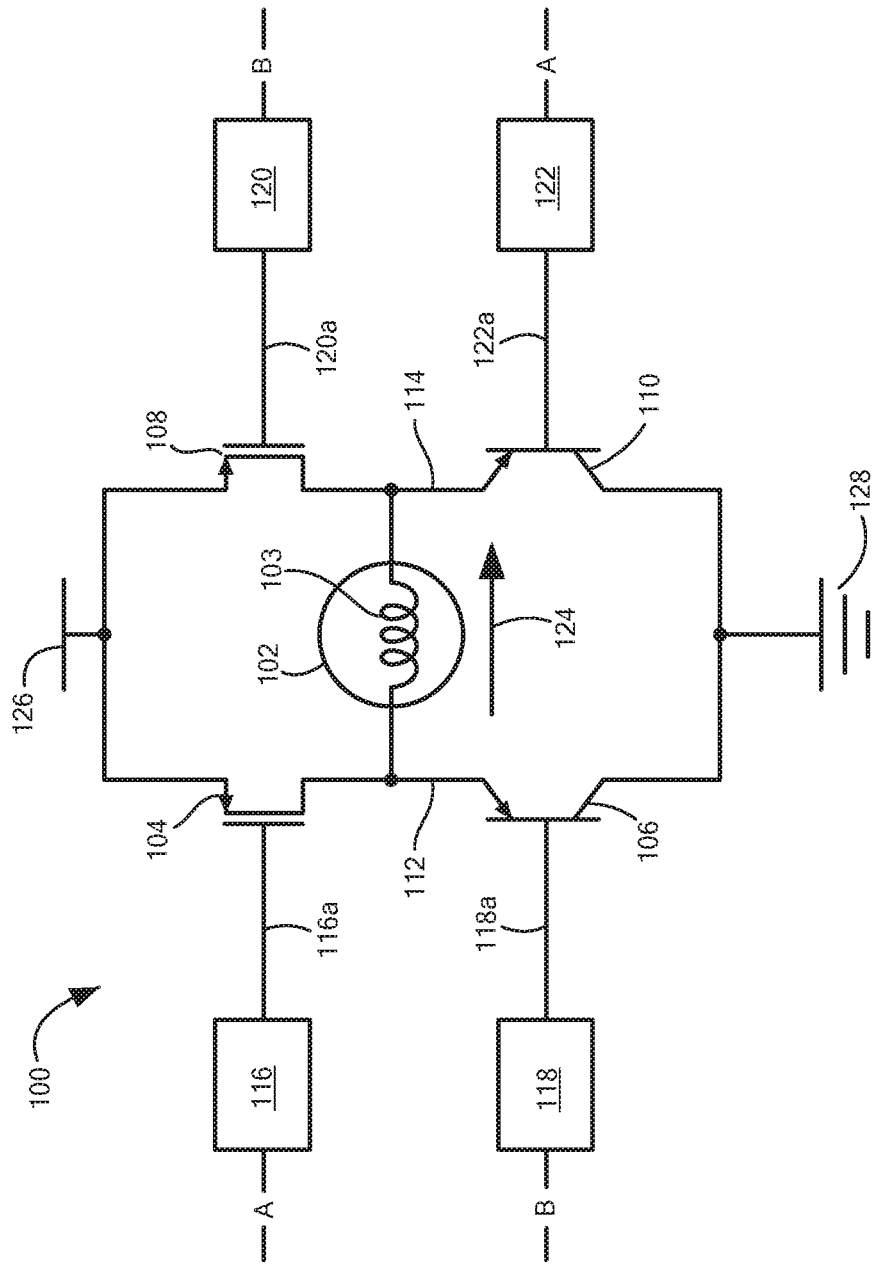
FIG. 1 is a circuit diagram of a coil driver circuit.

As used herein, the term "magnetic field sensing element" is used to describe a variety of electronic elements that can sense a magnetic field. The magnetic field sensing element can be, but is not limited to, a Hall Effect element, a magnetoresistance element, or a magnetotransistor. As is known, there are different types of Hall Effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb). The magnetic field sensing element may also be a spin-valve or similar structure having a plurality of material layers of different chemical elements.

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel or perpendicular to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased coil or magnet, and a magnetic field sensor that senses a magnetic field density of a magnetic field.

As used herein, the terms "target" and "magnetic target" are used to describe an object to be sensed or detected by a magnetic field sensor or magnetic field sensing element.

FIG. 1 is a circuit diagram of a switched driver circuit 100 for driving an inductive load 102. In embodiments, load 102 comprises a coil 103 that can be used to produce a magnetic field that can be detected by a magnetic field sensor. However, load 102 may be any type of inductive load such as a motor coil, etc.

Switched driver circuit 100 may be coupled to the end terminals of coil 103 to drive an alternating current through coil 103. Load 102 may have multiple coils. In some cases, a single circuit 100 may drive all the coils included in load 102. In other cases, multiple driver circuits may be included to drive multiple coils.

Switched driver circuit 100 has a first switch 104, a second switch 106, a third switch 108, and a fourth switch 110 arranged in a bridge circuit configuration. Switches 104-110 turn on and off in a timed sequence to drive current through coil 103. Driver circuits 116, 118, 120, and 122 are coupled to control terminals of switches 104, 106, 108, and 110, respectively. Driver circuits 116-122 drive signals 116a-122a, respectively, to open and close switches 104-110.

Switches 104 and 106 may be connected in series between power terminal 126 and reference terminal 128 to form a first output terminal at node 112. Switches 108 and 110 may also be connected in series between power terminal 126 and reference terminal 128 to form a second output terminal at node 114. Coil 103 may comprise two terminals: one connected to node 112 and the other connected to node 114.

In embodiments, switches 106 and 110 are bipolar junction transistors ("BJTs") and control circuits 118 and 122 are coupled to the base terminals of the BJTs. In this case, driver circuits 118 and 122 will sink (or source) current to the base terminal to turn switches 106 and 110 on and off.

As shown, switches 106 and 110 may be PNP BJTs coupled in a common collector configuration. For example, the collector terminals of BJT 106 and 110 may be coupled to reference node 128, and the emitter terminals of BJT 106 and 110 may be coupled to nodes 112 and 114, respectively.

Switches 104 and 108 are shown as PMOS field-effect transistors (FETs). However, switches 104 and 108 may be replaced by other devices that can act to allow or prevent current from flowing from terminal 126 to nodes 112 and 114.

Switched circuit 100 may include a power terminal 126 coupled to switches 104 and 108 that supplies power to circuit 100, and a reference or return terminal 128 that provides a current return path. In an embodiment, reference terminal 128 is a ground terminal.

During operation, driver circuits 116-122 will open and close switches 104-110 so that the current through coil 103 alternates. During the first time period, driver circuits 116 and 122 will close switches 104 and 110, and driver circuits 118 and 120 will open switches 106 and 108, so that current can flow from power terminal 126, through switch 104 in the direction of arrow 124 to node 112, through coil 103 to node 114, and through switch 110 to reference terminal 128. During the next time period, driver circuits 116 and 122 will open switches 104 and 110, and driver circuits 118 and 120 will close switches 106 and 108, so that current can flow from power terminal 126, through switch 108 to node 114, through coil 103 in the opposite direction of arrow 124 to node 112, and through switch 106 to reference terminal 128. Circuit 100 will repeatedly alternate the current through coil 103 over time thus generating an alternating magnetic field.

Because coil 103 is an inductive element, coil 103 resists changes to the current running through it. The inductive effect can cause changes in the voltages at nodes 112 and 114. For example, assume that current is flowing through coil 103 in the direction of arrow 124. When switches 106 and 108 close and switches 104 and 110 open, the voltage across coil 103 reverses and circuit 100 begins to drive current through coil 103 in the direction opposite to arrow 124. The voltage across coil 103 may begin to drive current in the direction opposite to arrow 124. However, because the inductive load resists changes to current, the current does not change instantaneously. Instead, for a time after the switch, the current continues to flow in the direction of arrow 124.

During this time, as current continues to flow in the direction of arrow 124, driver circuit 118 may drive signal 118a low (i.e. to ground) and driver circuit 116 may drive signal 116a high. As current continues to flow from node 112 in the direction of arrow 124, the voltage at 112 may become negative. While the voltage at node 112 is negative, switch 106 may be effectively open, i.e. in a state so that current cannot flow from reference terminal 128 to output terminal 112. Driving signal 116a high may place switch 104 in a state so that current cannot flow from power terminal 126 to output terminal 112. In other words, as current continues to flow out of node 112 in the direction of arrow 124, switches 104 and 106 are "open" so that current cannot flow into node 112 from terminals 126 or 128. This may allow the current flowing out of node 112 to deplete charge from (the capacitances associated with) node 112 to create a negative voltage at node 112.

Node 112 may include parasitic capacitance. The capacitance may be a result of the formation of node 112 on a substrate, for example. It may also be a result of parasitic capacitance associated with switches 104 and 106 that is coupled to node 112. In other arrangements, a capacitor may be purposely included between 112 and other nodes. Thus, as current continues to flow in the direction of arrow 124, charge is depleted from node 112 and the voltage at node 112 may become negative (i.e. less than the voltage at reference terminal 128). Also, the voltage at node 114 may be high because switch 108 is closed, effectively tying node 114 to power terminal 126. This creates a voltage differential from node 114 to node 112.

As the capacitances at node 112 continue to deplete and the voltage at node 112 becomes more negative, the voltage differential from node 114 to node 112 increases. As the voltage differential increases, it tends to drive current harder in the direction opposite arrow 124, which may cause the current through coil 103 to switch direction faster than it would otherwise if the voltage differential from node 114 to 112 were smaller. In embodiments, the voltage differential from node 114 to node 112 may become larger than the voltage from power terminal 126 to reference terminal 128

Eventually, as the current through coil 103 reverses and begins to flow in the direction opposite arrow 124, the parasitic capacitances associated with node 112 will charge and the voltage at node 112 will increase. Once the voltage at node 112 increases to a level higher than that of signal 118a, switch 106 will turn on and begin to conduct current from node 112 to reference terminal 128 (and from node 112 to the base terminal of BJT 106).

Switching circuit 100 may continuously switch the current through coil 103. After the current through coil 103 reaches a steady state in the direction opposite arrow 124, switching circuit 100 may switch again and begin to drive current in the direction of arrow 124. In this case, immediately after the switch occurs, the inductive effect of coil 103 may cause current to continue to flow in the direction opposite arrow 124. This may cause the voltage at node 114 to drop below the voltage at reference node 128. The switching process that switches current from the direction opposite arrow 124 to the direction of arrow 124 may mirror the switching process described above that switches current from the direction of arrow 124 to the direction opposite arrow 124.

Figure 2:
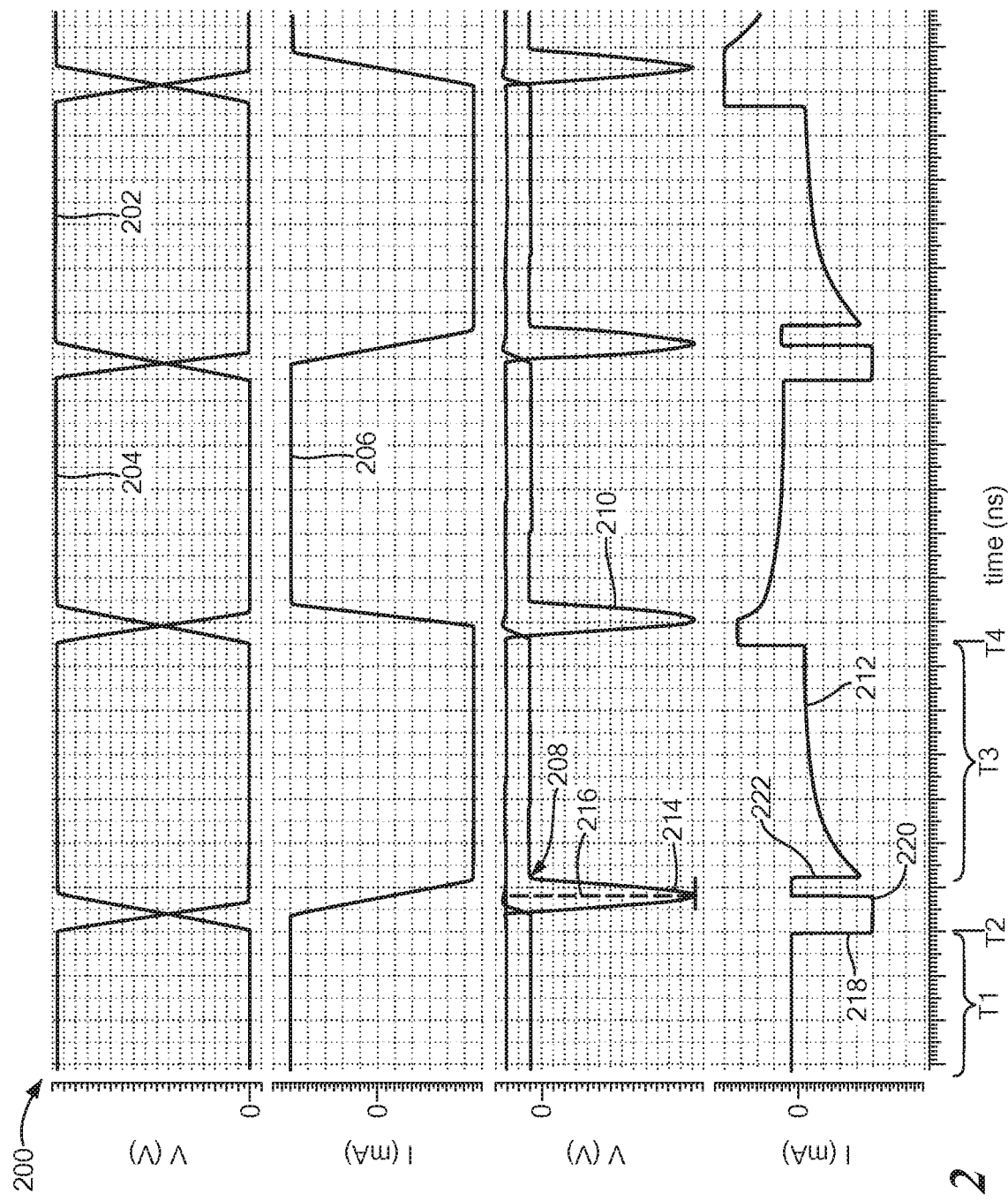
FIG. 2 is a timing diagram of signals relating to the coil driver circuit of FIG. 1.

Referring to FIG. 2, graph 200 provides examples of various waveforms associated with switching circuit 100. The horizontal axis represents time. Vertical axes for waveforms 202, 204, 208, and 210 represent voltage. The vertical axes for waveforms 206 and 212 represent current. Any scales and values in FIG. 2 (and the other figures) are provided to illustrate an example of the timing and levels of the various signals. Real world circuits like switching circuit 100 may operate with different timing and signal levels.

Waveform 202 represents signal "A" in FIG. 1. When waveform 202 is high, switch 104 and switch 110 may be in non-conducting states, and when waveform 202 is low, switch 104 and switch 110 may be in conducting states. Waveform 204 represents signal "B" in FIG. 1. When waveform 204 is high, switches 106 and 108 may be in non-conducting states, and when waveform 204 is low, switches 106 and 108 may be in conducting states.

Waveform 206 represents the current through coil 103. When waveform 206 is positive, current is flowing through coil 103 in the direction of arrow 124. When waveform 206 is negative, current is flowing through coil 103 in the direction opposite arrow 124.

Waveform 208 represents the voltage at node 112 and waveform 210 represents the voltage at node 114.

Waveform 212 represents the base current of BJT switch 106 (i.e. signal 118a). When waveform 212 is negative, current is flowing out of the base terminal of switch 106. When waveform 212 is positive, current is flowing into the base terminal of switch 106.

During time period T1, current is flowing through coil 103 in the direction of arrow 124. The circuit is at steady state. Signal 204 is high and signal 202 is low, indicating that switches 104 and 110 are conducting current, and switches 106 and 108 are open.

At time T2, signal 204 transitions to a low state and signal 202 transitions to a high state. This causes switches 104 and 110 to stop conducting current. This also causes switch 108 to close so that the voltage at node 114 is the same as the voltage at power terminal 126. In response to signal 204, driver circuit 118 drives the voltage at the base of switch 106 to reference terminal 128.

As described above, immediately after signals 204 and 202 change states, the current through coil 103 continues to flow in the direction of arrow 124. The current depletes charge from capacitances associated with node 112 and causes the voltage at node 112 to drop below that of reference terminal 128, as illustrated by negative voltage spike 214 of signal 208. The voltage differential 216 between nodes 114 and 112 helps to reverse the flow of current through coil 103 by driving current in the direction opposite arrow 124.

As the current 206 through coil 103 reverses, the parasitic capacitance associated with node 112 charges and the voltage at node 112 rises, as illustrated by the rising edge of voltage spike 214. When the voltage reaches point 208, the voltage across the emitter-base junction of switch 106 is sufficiently high so that switch 106 begins to conduct current. Steady state is reached in time period T3 with current flowing through coil 103 opposite arrow 124.

At time T4, signals 202 and 204 switch again. The process is mirrored, causing a negative voltage spike 210 at node 114 as the current through coil 103 reverses.

Figure 3:
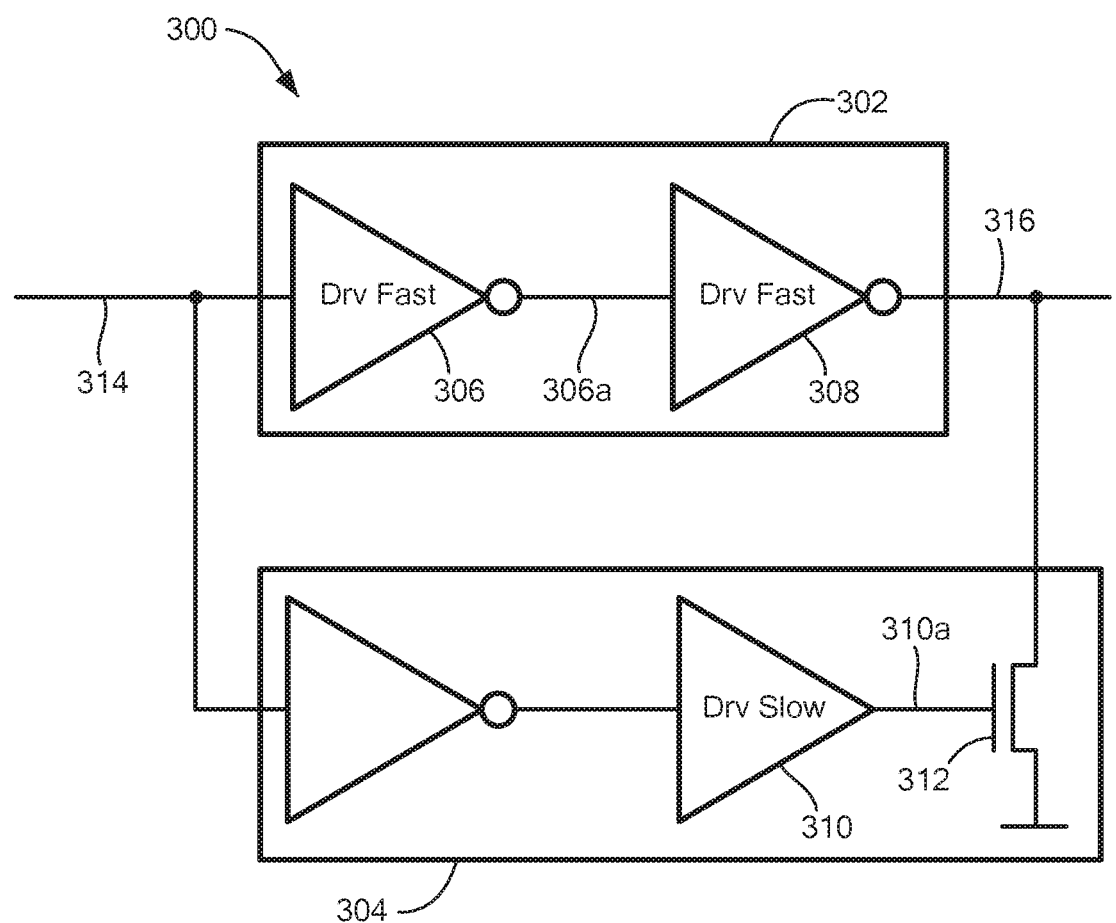
FIG. 3 is a circuit diagram of a gate driver circuit.

Referring to FIG. 3, driver circuit 300 may be the same as or similar to driver circuit 118 and/or 122. In embodiments, driver circuit 300 may be configured to drive the base terminal of a PNP BJT switch, such as switch 106 or 110.

Driver circuit 300 may include a fast driver circuit 302 and a slow driver circuit 304. In the embodiment shown in FIG. 3, fast driver circuit 302 may comprises a pair of inverters 306 and 308 coupled in series, and slow driver circuit 304 may comprise a buffer 310 and switch 312. In embodiments, switch 312 may be an n-channel field-effect transistor.

Driver circuit 300 is coupled to receive input signal 314 and drive output signal 316. Output signal 316 may be coupled to the base terminal of PNP BJT switch 106 or 110. Because driver circuit 300 drives the base terminal of a PNP BJT switch, the output of driver circuit 300 may be configured to sink (or source) current to the base terminal.

In embodiments, fast driver circuit 302 may have a relatively fast turn-on time. For example, when signal 314 transitions from a high value to a low value, there may be a relatively short delay before the output of inverter 308 transitions from a high value to a low value and begins sinking current from the base of the BJT switch 106. In contrast, slow driver circuit 304 may have a relatively slow turn-on time. For example, when signal 314 transitions from a high value to a low value, there may be a relatively longer time delay before the output of switch 312 turns on and begins sinking current from the base of the BJT switch 106.

In addition, fast driver circuit 302 may be current limited so that it may sink (or source) a relatively small amount of current from the base of the BJT switch 106. In contrast, slow driver circuit 304 may be configured to sink a relatively larger amount of current from the base of BJT switch 106.

Figure 4:
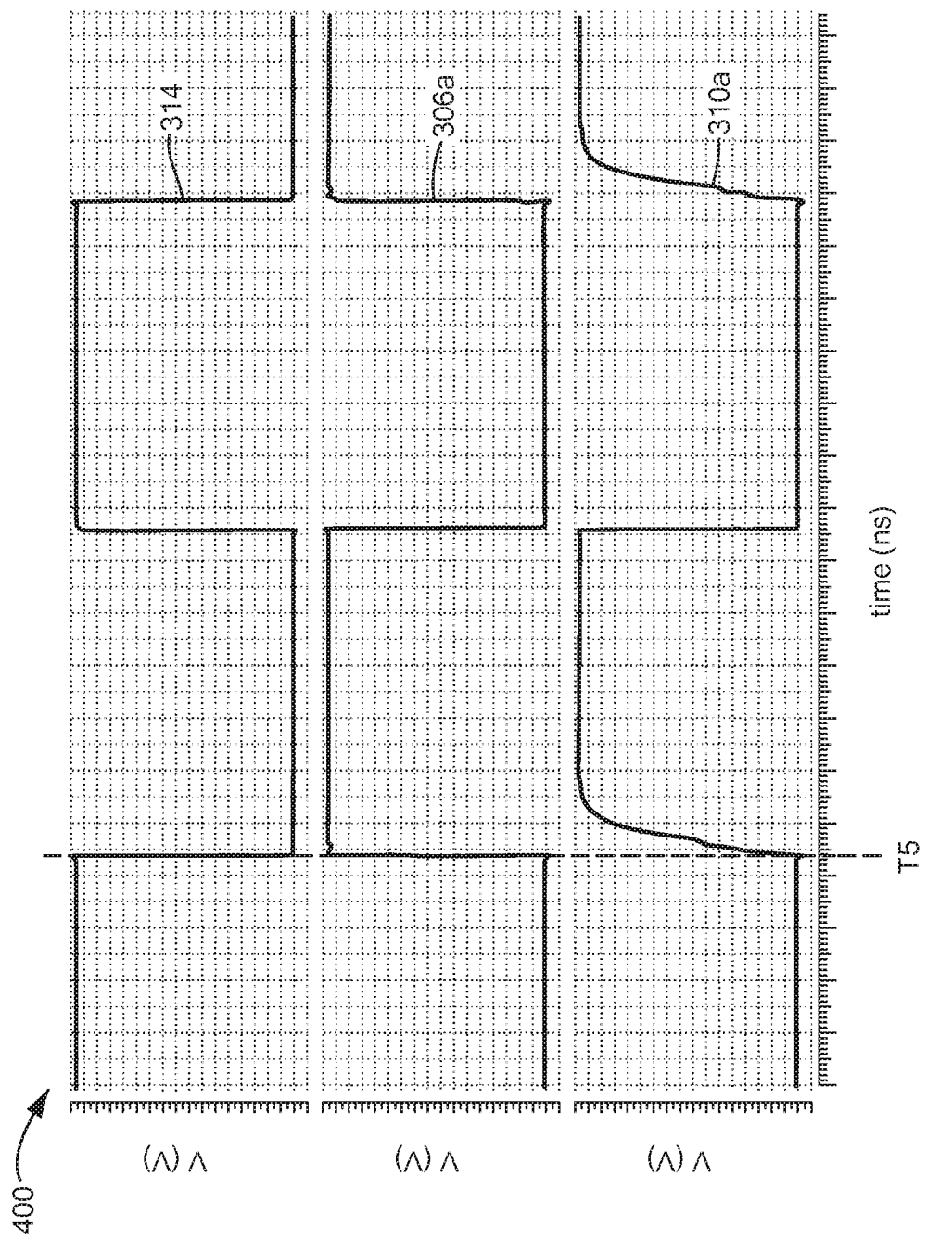
FIG. 4 is a timing diagram of signals relating to the gate driver circuit of FIG. 3.

Referring also to FIG. 4, graph 400 includes example waveforms for signals 314, 306a, and 310a. The horizontal axis represents time and the vertical axes represent voltage.

When signal 314 transitions from high to low at time T5, signal 306a transitions from low to high quickly afterward. This indicates that fast driver circuit 302 may be sinking current from the base terminal of BJT switch 106. At a later time, signal 310a transitions from low to high and turns switch 312 on. This indicates that slow driver circuit 304 may be sinking current from the base terminal of BJT switch 106. As shown, fast driver circuit 302 may sink current first, before slow driver circuit 304 begins sinking current.

Referring again to FIG. 2, waveform 212 shows an example of the base current of switch 106. Immediately after switching circuit 100 switches, fast driver circuit 302 begins sinking current from the base of BJT switch 106 as shown by current spike 218. Current spike 218 has a flat cut-off 220 because fast driver circuit 302 limits the amount of current that it sinks. At a later time, slow driver circuit 304 begins sinking current from the base of BJT switch 106 as shown by current spike 222. Both slow and fast driver circuit 304 and 302 may continue to sink current from the base of BJT switch 106 through the steady state time period T3 until switching circuit 100 switches again at time T4.

Having a fast driver circuit 302 and a slow driver circuit 304 in parallel may prevent the current spike 218 from becoming too large after switching circuit 100 switches. Without limiting the current drawn from the base terminal, parasitic capacitance associated with the base of BJT switch 106 could cause current spike 218 to become large, which could cause switch 106 and/or its associated wiring to fail due to overcurrent. The current limited fast driver circuit 302 dissipates the charge associated with the parasitic capacitance so that current spike 218 does not become too large. After (at least part of) the charge is dissipated, slow driver circuit adds to the drive of the base current of BJT switch 106 so that BJT switch 106 can sink current from coil 103.

Having described preferred embodiments, which serve to illustrate various concepts, structures and techniques, which are the subject of this patent, it will now become apparent to those of ordinary skill in the art that other embodiments incorporating these concepts, structures and techniques may be used. Accordingly, the scope of the patent should not be limited to the described embodiments but rather should be limited only by the spirit and scope of the following claims. All references cited in this patent are incorporated here by reference in their entirety.

The invention claimed is:

1. A driver circuit comprising:
a power terminal;
a reference terminal; and
a bridge circuit comprising:
a first switch coupled to the power terminal;
a second switch coupled in series between the first switch and the reference terminal to form a first output terminal between the first and second switches;
a third switch coupled to the power terminal;
a fourth switch coupled in series between the third switch and the reference terminal to form a second output terminal between the third and fourth switches;
a first base driver circuit coupled to a control terminal of the second switch; and
a second base driver circuit coupled to a control terminal of the fourth switch;
wherein the second and fourth switches are PNP BJT devices; wherein:
the first base driver circuit comprises a fast drive circuit and a slow drive circuit coupled to the control terminal of the second switch, wherein a current limit of the fast drive circuit is lower than a current limit of the slow drive circuit; and/or
the second base driver circuit comprises a fast drive circuit and a slow drive circuit coupled to the control terminal of the fourth switch, wherein a current limit of the fast drive circuit is lower than a current limit of the slow drive circuit.

2. The driver circuit of claim 1 wherein a collector terminal of the second switch is coupled to the reference terminal and a collector terminal of the fourth switch is coupled to the reference terminal.

3. The driver circuit of claim 1 wherein the reference terminal is a ground terminal.

4. The driver circuit of claim 1 wherein the first and second output terminals are configured to provide switched power to a load.

5. The driver circuit of claim 1 wherein the second switch is coupled so that a negative voltage at the first output terminal does not cause current to flow from the reference terminal to the first output terminal through the second switch.

6. The driver circuit of claim 1 wherein the fourth switch is coupled so that a negative voltage at the second output terminal does not cause current to flow from the reference terminal to the second output terminal through the fourth switch.

7. The driver circuit of claim 1 wherein a turn-on time of the fast drive circuit is less than a turn-on time of the slow drive circuit.

8. The driver circuit of claim 1 wherein the second switch is configured to enter a non-conductive state that allows a current through the coil to cause a voltage at the first output terminal to become lower than a voltage at the reference terminal.

9. The driver circuit of claim 8 wherein the second switch is further configured to enter a conductive state as the voltage at the first output terminal rises to a level above the voltage at the reference terminal.

10. The driver circuit of claim 1 wherein the fourth switch is configured to enter a non-conductive state that allows a current through the coil to cause a voltage at the second output terminal to become lower than a voltage at the reference terminal.

11. The driver circuit of claim 10 wherein the fourth switch is further configured to enter a conductive state as the voltage at the second output terminal rises to a level above the voltage at the reference terminal.

12. The driver circuit of claim 1 wherein the first and third switches comprise P-channel field effect transistors.

13. A system comprising:
a coil having a first winding terminal and a second winding terminal;
a power terminal;
a reference terminal;
a bridge circuit comprising:
a first switch coupled to the power terminal;
a second switch coupled in series between the first switch and the reference terminal to form a first output terminal between the first and second switches, wherein the first output terminal is coupled to the first winding terminal of the coil;
a third switch coupled to the power terminal;
a fourth switch coupled in series between the third switch and the reference terminal to form a second output terminal between the third and fourth switches, wherein the second output terminal is coupled to the second winding terminal of the coil;
a first base driver circuit coupled to a control terminal of the second switch; and
a second base driver circuit coupled to a control terminal of the fourth switch;
wherein the second and fourth switches are PNP BJT devices; and
wherein the first base driver circuit comprises a fast drive circuit and a slow drive circuit coupled to the control terminal of the second switch, wherein a current limit of the fast drive circuit is lower than a current limit of the slow drive circuit; and/or
the second base driver circuit comprises a fast drive circuit and a slow drive circuit coupled to the control terminal of the fourth switch, wherein a current limit of the fast drive circuit is lower than a current limit of the slow drive circuit.

14. The system of claim 13 wherein a collector terminal of the second switch is coupled to the reference terminal and a collector terminal of the fourth switch is coupled to the reference terminal.

15. The system of claim 13 wherein the reference terminal is a ground terminal.

16. The system of claim 13 wherein the first and second output terminals are configured to provide switched power to the coil.

17. The system of claim 13 wherein the second switch is coupled so that a negative voltage at the first output terminal does not cause current to flow from the reference terminal to the first output terminal through the second switch.

18. The system of claim 13 wherein the fourth switch is coupled so that a negative voltage at the second output terminal does not cause current to flow from the reference terminal to the second output terminal through the fourth switch.

19. The system of claim 13 wherein the first and third switches comprise P-channel field effect transistors.

20. A driver circuit comprising:
a power terminal;
a reference terminal; and
a bridge circuit comprising:
a first switch coupled to the power terminal;
a second switch coupled in series between the first switch and the reference terminal to form a first output terminal between the first and second switches;
a third switch coupled to the power terminal;
a fourth switch coupled in series between the third switch and the reference terminal to form a second output terminal between the third and fourth switches;
a first base driver circuit coupled to a control terminal of the second switch; and
a second base driver circuit coupled to a control terminal of the fourth switch;
wherein the second and fourth switches are PNP BJT devices;
wherein one or both of the first base driver circuit and the second base driver circuit comprises a fast drive circuit and a slow drive circuit and wherein a current limit of the fast drive circuit is lower than a current limit of the slow drive circuit.

21. A system comprising:
a coil having a first winding terminal and a second winding terminal;
a power terminal;
a reference terminal;
a bridge circuit comprising:
a first switch coupled to the power terminal;
a second switch coupled in series between the first switch and the reference terminal to form a first output terminal between the first and second switches, wherein the first output terminal is coupled to the first winding terminal of the coil;
a third switch coupled to the power terminal;
a fourth switch coupled in series between the third switch and the reference terminal to form a second output terminal between the third and fourth switches, wherein the second output terminal is coupled to the second winding terminal of the coil;
a first base driver circuit coupled to a control terminal of the second switch; and
a second base driver circuit coupled to a control terminal of the fourth switch;
wherein the second and fourth switches are PNP BJT devices;
wherein one or both of the first base driver circuit and the second base driver circuit comprises a fast drive circuit and a slow drive circuit and wherein a current limit of the fast drive circuit is lower than a current limit of the slow drive circuit.

* * * * *